(12) United States Patent
Kobayashi et al.

(10) Patent No.: US 12,551,973 B2
(45) Date of Patent: Feb. 17, 2026

(54) WAFER PROCESSING METHOD

(71) Applicant: DISCO CORPORATION, Tokyo (JP)

(72) Inventors: Satoshi Kobayashi, Tokyo (JP); Kai Minamizaki, Tokyo (JP); Akira Mizutani, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 387 days.

(21) Appl. No.: 18/457,519

(22) Filed: Aug. 29, 2023

(65) Prior Publication Data
US 2024/0082960 A1 Mar. 14, 2024

(30) Foreign Application Priority Data
Sep. 9, 2022 (JP) .................. 2022-143873

(51) Int. Cl.
*B23K 26/53* (2014.01)
*H01L 21/304* (2006.01)
*H01L 21/67* (2006.01)
*H01L 21/683* (2006.01)

(52) U.S. Cl.
CPC ............ *B23K 26/53* (2015.10); *H01L 21/304* (2013.01); *H01L 21/67092* (2013.01); *H01L 21/6836* (2013.01); *H01L 2221/68327* (2013.01)

(58) Field of Classification Search
CPC ............. H01L 21/304; H01L 21/67092; H01L 21/6836
See application file for complete search history.

(56) References Cited

U.S. PATENT DOCUMENTS

| | | | | |
|---|---|---|---|---|
| 2020/0111658 A1* | 4/2020 | Sugiya | ................ | B23K 26/354 |
| 2022/0044935 A1* | 2/2022 | Mori | ...................... | B23K 26/53 |
| 2022/0168850 A1* | 6/2022 | Yamashita | ........ | B23K 37/0408 |
| 2022/0184733 A1* | 6/2022 | Mori | ..................... | H01L 21/304 |
| 2022/0250190 A1* | 8/2022 | Tanoue | ................ | B23K 26/53 |
| 2022/0250191 A1* | 8/2022 | Tanoue | ................ | B23K 26/402 |

FOREIGN PATENT DOCUMENTS

| | | |
|---|---|---|
| JP | 2007158239 A | 6/2007 |
| JP | 2020057709 A | 4/2020 |

* cited by examiner

*Primary Examiner* — Jeff W Natalini
*Assistant Examiner* — Rose Keagy
(74) *Attorney, Agent, or Firm* — GREER BURNS & CRAIN, LTD

(57) ABSTRACT

A wafer processing method includes emitting a laser beam along an annular line that is a predetermined distance inward of the outer circumferential edge of the first wafer to form, in the first wafer, an annular first modified layer and a first crack extending from the first modified layer to make an appearance on the front surface, thereby causing the first wafer to become warped at an outer circumferential region thereof that lies closer to the outer circumferential edge than does the first modified layer and the first crack; bonding the front surface of the first wafer to a second wafer to form a bonded wafer stack; and grinding a rear surface of the first wafer of the bonded wafer stack to thin the first wafer to a finish thickness.

5 Claims, 12 Drawing Sheets

WAFER PROCESSING METHOD

BACKGROUND OF THE INVENTION

Field of the Invention

The present invention relates to a wafer processing method.

Description of the Related Art

In recent years, development of three-dimensional semiconductor wafer stacks has been progressing with reduced height and increased integration of device chips. For example, through-silicon via (TSV) wafers allow electrodes of two chips bonded to each other to be connected to each other using through electrodes.

Such a wafer is ground and thinned in a state of being bonded to a support wafer (made of silicon, glass, ceramic, or the like) serving as a base. A wafer typically has a chamfered outer circumferential edge, and when the wafer is ground to a very small thickness, the outer circumferential edge thereof may become what is called a knife edge, and a cut of the edge may easily occur during grinding. Such a cut might extend into a device, resulting in damage to the device.

As a measure to address the problem of the knife edge, what is called an edge trimming technique, which annularly cuts an outer circumferential edge of a wafer at a front surface thereof, has been developed (see Japanese Patent No. 4895594). In addition, an edge trimming method in which a laser beam is applied along an outer circumferential edge of a device to form an annular modified layer and grinding is thereafter performed has been devised to reduce or eliminate the likelihood that a cut that occurs in the edge of the wafer during grinding will extend into a device (see JP 2020-057709A).

SUMMARY OF THE INVENTION

However, the method of Japanese Patent No. 4895594 has problems in that, when the outer circumferential edge of the wafer is annularly cut at the front surface thereof, a chipping that reaches a device to damage the device can occur and a device may be easily contaminated with a large number of chips that occur. Meanwhile, the method of JP 2020-057709A has a problem in that, because a bonding layer that bonds wafers together extends even radially outside of the annularly formed modified layer, regions of the wafers radially outside of the modified layer remain bonded to each other, which may lead to a failure of an unnecessary outer circumferential region to be removed. If the outer circumferential region is left unremoved, the region radially outside of the annular modified layer and a region radially inside of the annular modified layer may strike each other, resulting in damage, and a polishing pad may be damaged in a polishing step that follows.

Accordingly, the present invention has been conceived to provide a wafer processing method that makes it possible to remove an unnecessary outer circumferential region of a wafer during grinding of a bonded wafer stack while reducing or eliminating the likelihood of damage to a device.

In accordance with an aspect of the present invention, there is provided a wafer processing method including a first modified layer forming step of emitting, onto a first wafer having a plurality of devices formed on a front surface thereof and having a chamfered outer circumferential edge, a laser beam at a wavelength capable of transmitting the first wafer such that the laser beam is applied along an annular line that is a predetermined distance inward of the outer circumferential edge of the first wafer to form, in the first wafer, an annular first modified layer and a first crack extending from the first modified layer to make an appearance on the front surface of the first wafer, thereby causing the first wafer to become warped at an outer circumferential region thereof that lies closer to the outer circumferential edge than do the first modified layer and the first crack, a bonded wafer stack forming step of, after the first modified layer forming step is performed, bonding the front surface of the first wafer to a second wafer to form a bonded wafer stack, and a grinding step of, after the bonded wafer stack forming step is performed, grinding a rear surface of the first wafer of the bonded wafer stack to thin the first wafer to a finish thickness.

Preferably, the wafer processing method further includes, after the bonded wafer stack forming step and before the grinding step, a second modified layer forming step of emitting a laser beam at a wavelength capable of transmitting the first wafer to enter into the first wafer through the rear surface such that the laser beam is applied along the annular line that is the predetermined distance inward of the outer circumferential edge of the first wafer to form, in the first wafer, an annular second modified layer and a second crack extending from the second modified layer to be joined to the first modified layer, and a removing step of applying an external force to the outer circumferential region to remove the outer circumferential region.

Preferably, the wafer processing method further includes, after the first modified layer forming step and before the grinding step, a third modified layer forming step of emitting a laser beam at a wavelength capable of transmitting the first wafer onto the outer circumferential region such that the laser beam is applied in a radial manner to form radial third modified layers that divide the outer circumferential region into at least two sections.

Preferably, the wafer processing method further includes the following step performed before the bonded wafer stack forming step: a fourth modified layer forming step of emitting a laser beam at a wavelength capable of transmitting the first wafer onto the outer circumferential region such that the laser beam is applied along annular lines that are each a predetermined distance outward of the annular line along which the first modified layer is formed in the first modified layer forming step to form, in the first wafer, a plurality of annular fourth modified layers and a plurality of fourth cracks each extending from a corresponding one of the fourth modified layers to make an appearance on the front surface of the first wafer.

Preferably, the wafer processing method further includes the following step performed before the bonded wafer stack forming step: a fifth modified layer forming step of emitting a laser beam at a wavelength capable of transmitting the first wafer onto the outer circumferential region to form, in the first wafer, a fifth modified layer and a fifth crack extending from the fifth modified layer in parallel with the front surface of the first wafer.

An aspect of the present invention makes it possible to remove an unnecessary outer circumferential region of a wafer during grinding of a bonded wafer stack while reducing or eliminating the likelihood of damage to a device.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Hereinafter, an embodiment of the present invention will be described in detail with reference to the accompanying drawings. It is to be understood that the following description of the embodiments is not meant to limit the present invention. It is also to be understood that constituent elements described below may be replaced with other constituent elements that a person skilled in the art could easily conceive of or other constituent elements that are essentially the same as those described below. Further, features described below may be combined as appropriate. Furthermore, various omissions, substitutions, or changes may be made with respect to the features without departing from the gist of the present invention.

Figure 1:
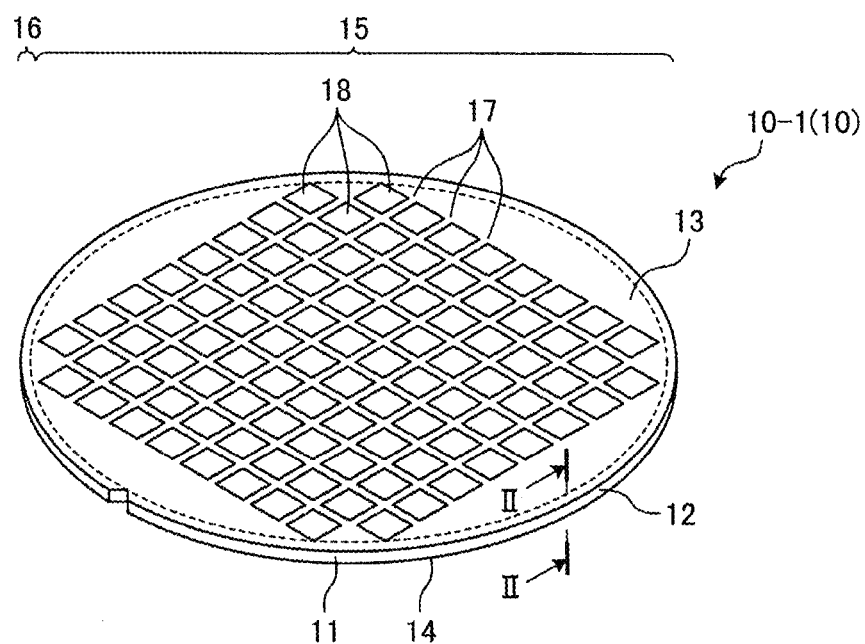
FIG. 1 is a perspective view of an example of a wafer to be processed by a wafer processing method according to an embodiment of the present invention.
Figure 2:
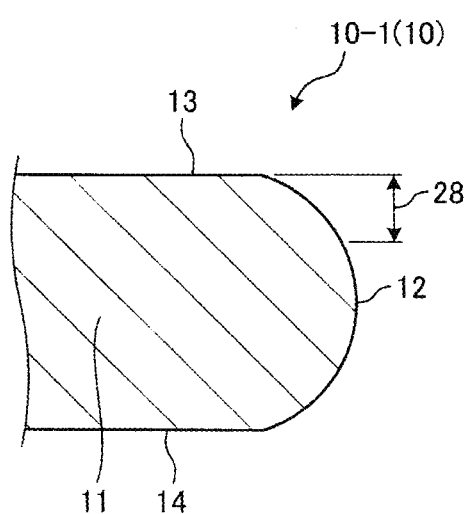
FIG. 2 is a sectional view thereof taken along line II-II in FIG. 1.

A method for processing a wafer 10 according to an embodiment of the present invention will be described below with reference to the accompanying drawings. FIG. 1 is a perspective view of an example of the wafer 10, which is to be processed by the method for processing the wafer 10 according to the embodiment. FIG. 2 is a sectional view thereof taken along line II-II in FIG. 1.

The wafer 10 illustrated in FIGS. 1 and 2 is a disk-shaped wafer, e.g., a semiconductor wafer or optical device wafer, which has a substrate 11 made of silicon (Si), sapphire ($Al_2O_3$), a gallium arsenide (GaAs), silicon carbide (SiC), or the like. In the present embodiment, the wafer 10 is a silicon wafer. Referring to FIG. 2, the wafer 10 has a chamfered outer circumferential edge 12, which has an arc-shaped section extending from a front surface 13 to a rear surface 14 of the substrate 11 with a middle in the thickness direction projecting most radially outward. The wafer 10 according to the present embodiment has a diameter of 300 mm and a thickness of 775 μm.

Referring to FIG. 1, the wafer 10 includes a device region 15 and an outer circumferential region 16 surrounding the device region 15 on the front surface 13 of the substrate 11. The device region 15 has a plurality of planned dividing lines 17 set in a grid pattern on the front surface 13 of the substrate 11 and has devices 18 formed in respective regions defined by the planned dividing lines 17. The outer circumferential region 16 is a region that extends all the way around the device region 15 and has no devices 18 formed thereon.

In the present embodiment, each device 18 forms a 3D NAND flash memory and includes electrode pads and through electrodes connected to the electrode pads. When the substrate 11 has been thinned, resulting in separation of the individual devices 18 from the wafer 10, the through electrodes pass up to the rear surface 14 of the substrate 11. That is, the wafer 10 according to the present embodiment is what is called a TSV wafer in which the devices 18 to be individually separated have through electrodes. Note that wafers 10 according to an embodiment of the present invention are not limited to TSV wafers having through electrodes and may be device wafers having no through electrodes.

Figure 3:
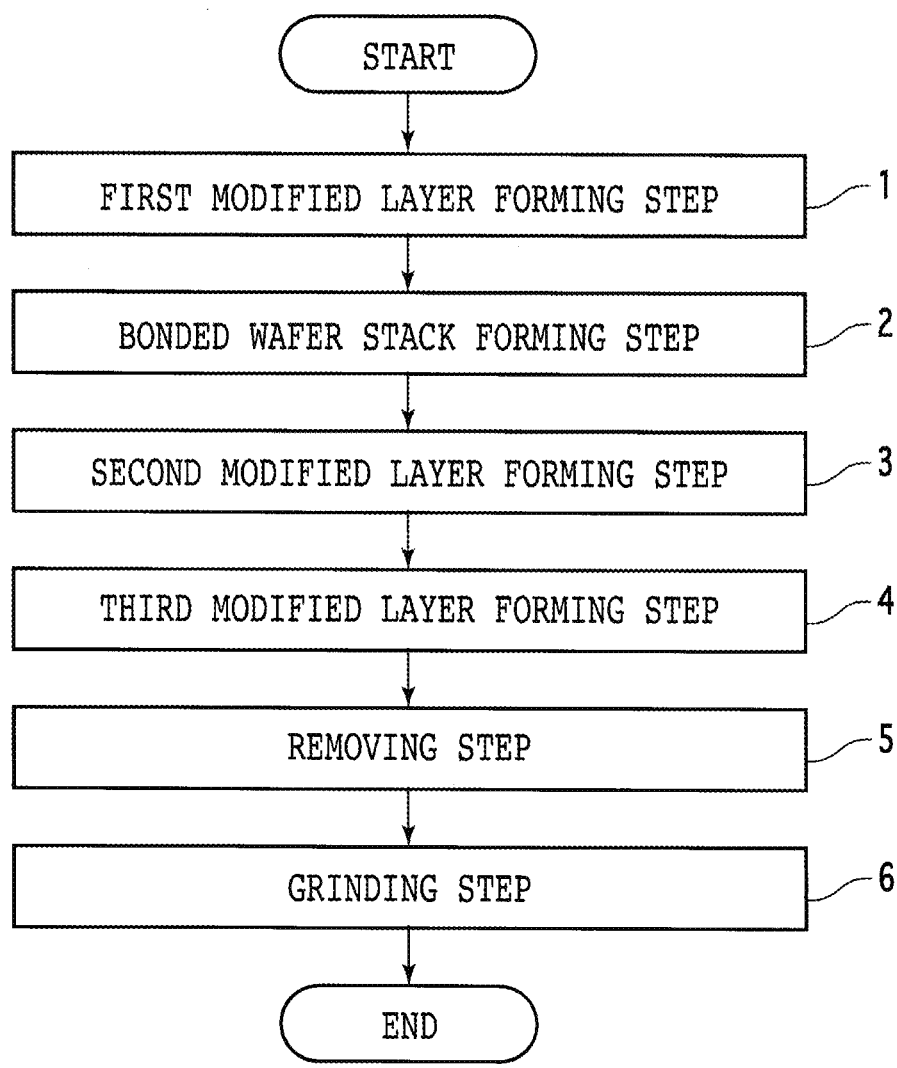
FIG. 3 is a flowchart illustrating a procedure of the wafer processing method according to the present embodiment.

FIG. 3 is a flowchart illustrating a procedure of the method for processing the wafer 10 according to the present embodiment. Referring to FIG. 3, the method for processing the wafer 10 according to the present embodiment includes a first modified layer forming step 1, a bonded wafer stack forming step 2, a second modified layer forming step 3, a third modified layer forming step 4, a removing step 5, and a grinding step 6. In the method for processing the wafer 10 according to the present embodiment, the front surfaces 13 of a pair of wafers 10 are bonded to each other, and one of the wafers 10 (i.e., a first wafer 10-1) is thinned to a predetermined finish thickness 26.

Note that, in the following description, when the two wafers 10 are to be differentiated from each other, one of the wafers 10 is referred to as the first wafer 10-1 and the other wafer 10 is referred to as a second wafer 10-2 (see FIG. 5), and, unless the two wafers 10 are to be differentiated from each other, the wafers 10 are referred to simply as the wafers 10. The other wafer 10, i.e., the second wafer 10-2, which is not thinned, is assumed to be a TSV wafer similar to the first wafer 10-1 in the description of the present embodiment but may alternatively be a simple substrate wafer with no pattern in another embodiment of the present invention. Note that, in a case where the second wafer 10-2 is a substrate wafer, the surface of the second wafer 10-2 which is bonded to the first wafer 10-1 is not limited to the front surface 13.

(First Modified Layer Forming Step 1)

Figure 4:
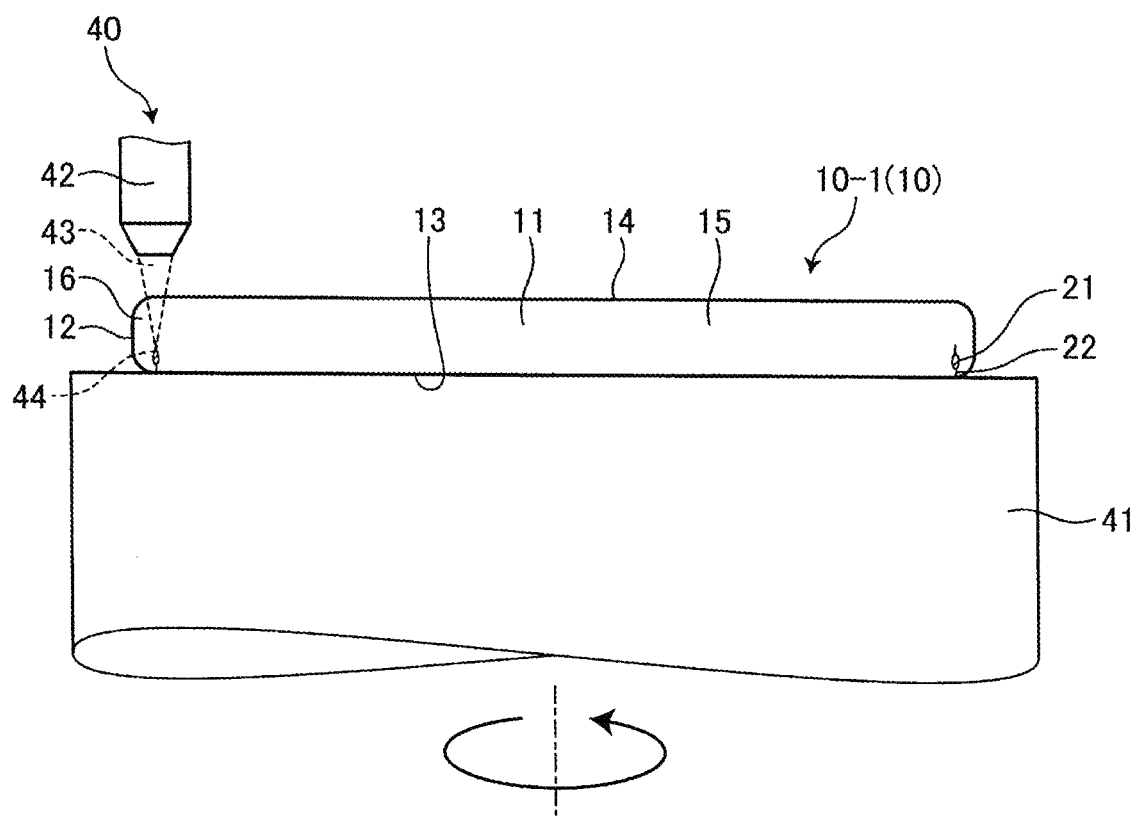
FIG. 4 is a side view illustrating, partly in section, a first modified layer forming step illustrated in FIG. 3.

FIG. 4 is a side view illustrating, partly in section, the first modified layer forming step 1 illustrated in FIG. 3. The first modified layer forming step 1 is a step of forming, in the first wafer 10-1, an annular first modified layer 21 and a first crack 22 along an annular line that is a predetermined distance inward of the outer circumferential edge 12 of the first wafer 10-1. The first crack 22 extends from the first modified layer 21 to make an appearance on the front surface 13. In the first modified layer forming step 1, the first modified layer 21 and the first crack 22 are formed in the first wafer 10-1 through stealth dicing using a laser processing apparatus 40.

The laser processing apparatus 40 includes a holding table 41 and a laser beam emitting unit 42. The holding table 41 is used to hold the wafer 10 on a holding surface thereof and is capable of rotating about a vertical axis. The laser beam emitting unit 42 emits a laser beam 43 onto the wafer 10 held on the holding table 41. The laser processing apparatus 40 further includes a moving unit (not illustrated) that causes the holding table 41 and the laser beam emitting unit 42 to move relative to each other, an imaging unit (not illustrated) that images the wafer 10 held on the holding table 41, and so on.

In the first modified layer forming step 1, the laser beam 43 is applied along the annular line that is the predetermined distance inward of the outer circumferential edge 12 of the first wafer 10-1, whereby an annular modified layer (i.e., the first modified layer 21) is formed. The annular line that is the predetermined distance inward of the outer circumferential edge 12 of the first wafer 10-1 refers to a boundary between the device region 15 and the outer circumferential region 16 and is annular in plan view. In the present embodiment, the predetermined distance is 2 mm. The laser beam 43 is a laser beam at a wavelength capable of transmitting the first wafer 10-1, and is, for example, an infrared ray (IR).

The term "modified layer" refers to a region that has come into a state different from that of surroundings thereof in terms of density, refractive index, mechanical strength, or other physical properties. Examples of modified layers include a region subjected to melting treatment, a crack region, a dielectric breakdown region, a region having a changed refractive index, and a mixture of such regions. The modified layer is lower in mechanical strength etc. than other portions of the first wafer 10-1.

In the first modified layer forming step 1, the front surface 13 of the first wafer 10-1 is first held under suction on the holding surface (i.e., an upper surface) of the holding table 41. Next, the first wafer 10-1 and a condenser of the laser beam emitting unit 42 are aligned. Specifically, using the moving unit (not illustrated), the holding table 41 is moved to an irradiation region under the laser beam emitting unit 42.

Next, the first wafer 10-1 is imaged by the imaging unit (not illustrated) and such an alignment as to cause an emitting portion of the laser beam emitting unit 42 to be vertically opposed to and directed toward a position that is the predetermined distance inward of the outer circumferential edge 12 is made, and thereafter, a focal point 44 of the laser beam 43 is set within the first wafer 10-1. At this time, the focal point 44 is set at a position that is closer to the front surface 13 than is the middle in the thickness direction of the first wafer 10-1.

In the first modified layer forming step 1, next, while the holding table 41 is caused to rotate about the vertical axis, the laser beam 43 is emitted from the laser beam emitting unit 42 to enter into the first wafer 10-1 through the rear surface 14 thereof. That is, the laser beam 43 is applied along the annular line that is the predetermined distance inward of the outer circumferential edge 12 of the first wafer 10-1, so that an annular continuous modified layer (i.e., the first modified layer 21) is formed.

At this time, a crack (i.e., the first crack 22) extends from the first modified layer 21 to make an appearance on the front surface 13. As mentioned above, when the first modified layer 21 is formed, the focal point 44 is preferably set at a position that is closer to the front surface 13 than is the position that divides the thickness of the first wafer 10-1 into two equal parts, thereby forming the first modified layer 21 in a region that is closer to the front surface 13 than is the position that divides the thickness of the first wafer 10-1 into two equal parts. Moreover, the first modified layer 21 is preferably formed at a position that allows the first crack 22 extending from the first modified layer 21 to make an appearance on the front surface 13.

The first modified layer 21 and the first crack 22 are expanded to cause the outer circumferential region 16 of the first wafer 10-1, which lies closer to the outer circumferential edge 12 than do the first modified layer 21 and the first crack 22, to expand more at the front surface 13 than at the rear surface 14. This causes the first wafer 10-1 to become warped at the outer circumferential region 16, with a protruding surface formed on the front surface 13. Once the first modified layer 21 and the first crack 22 are formed in an annular shape along the circumference of the first wafer 10-1, the first modified layer forming step 1 is finished, and the bonded wafer stack forming step 2 is started.

Note that, in the first modified layer forming step 1, a plurality of first modified layers 21 may be formed one above another in the thickness direction of the first wafer 10-1. This can be accomplished by applying the laser beam 43 a plurality of times with the height of the focal point 44 of the laser beam 43 changed for each application, or by applying a laser beam 43 having a plurality of focal points 44 apart from each other in the thickness direction of the first wafer 10-1. In this case, the first modified layers 21 arranged one above another in the thickness direction are, as a whole, formed at a position that is closer to the front surface 13 than is the middle in the thickness direction of the first wafer 10-1.

(Bonded Wafer Stack Forming Step 2)

Figure 5:
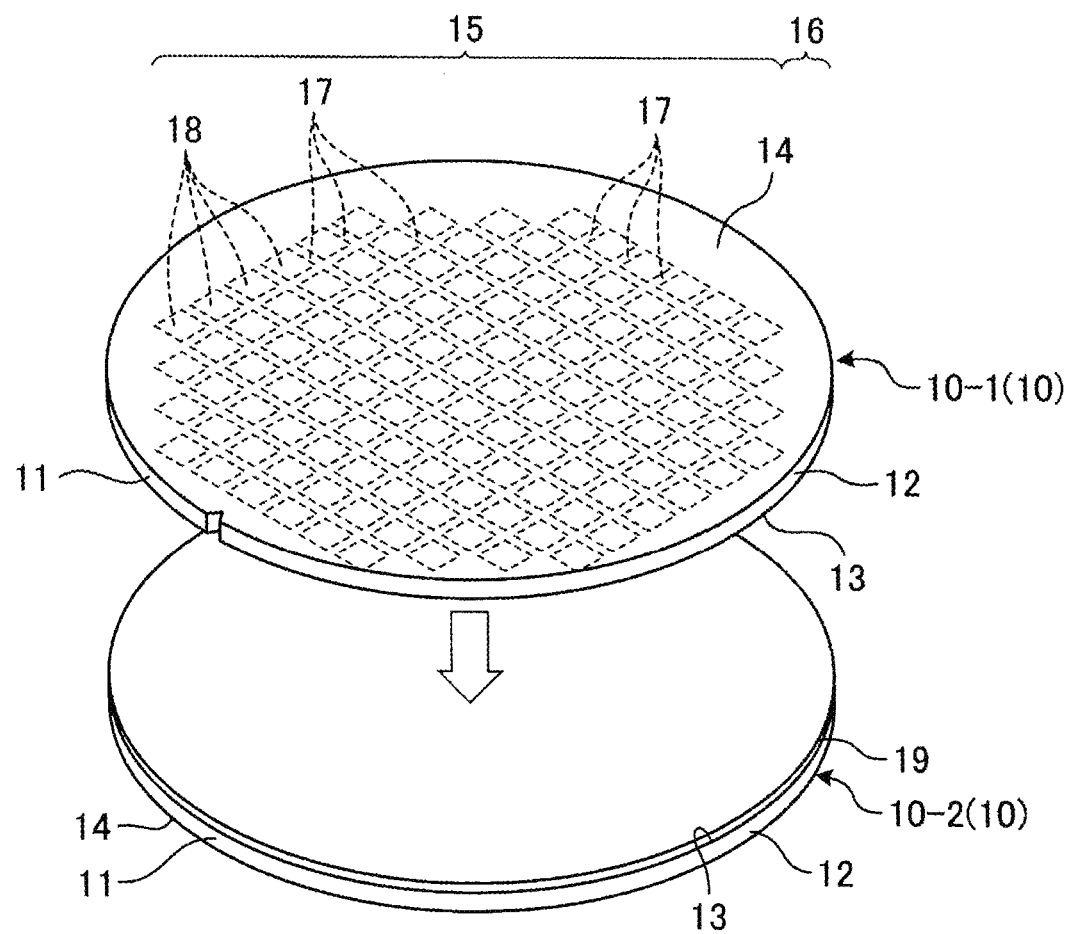
FIG. 5 is a perspective view illustrating one state of a bonded wafer stack forming step illustrated in FIG. 3.
Figure 6:
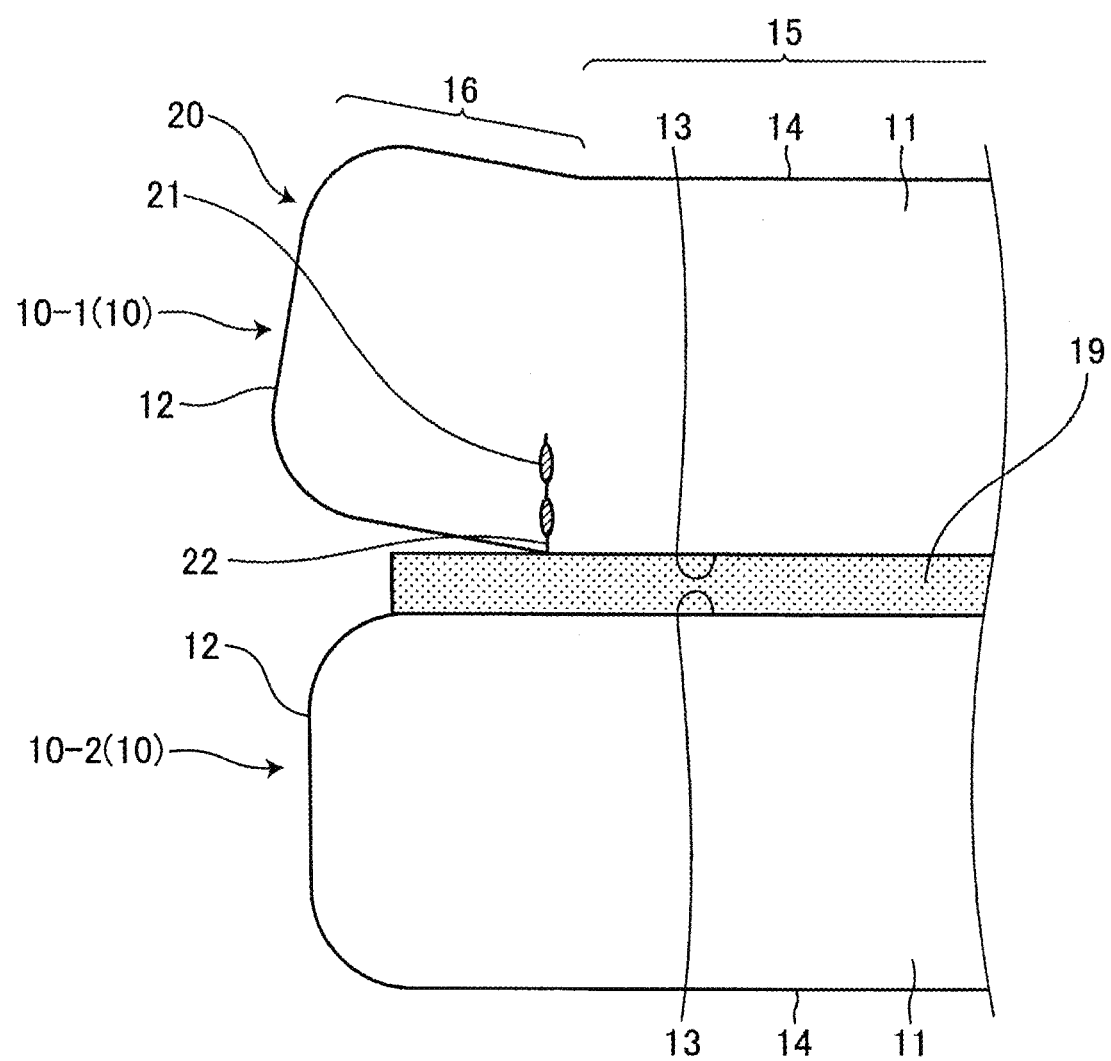
FIG. 6 is a sectional view illustrating a bonded wafer stack obtained after the bonded wafer stack forming step illustrated in FIG. 3.

FIG. 5 is a perspective view illustrating one state of the bonded wafer stack forming step 2 illustrated in FIG. 3. FIG. 6 is a sectional view illustrating a bonded wafer stack 20 obtained after the bonded wafer stack forming step 2 illustrated in FIG. 3. The bonded wafer stack forming step 2 is performed after the first modified layer forming step 1 is performed. The bonded wafer stack forming step 2 is a step of bonding the front surface 13 of the first wafer 10-1 to the second wafer 10-2 to form the bonded wafer stack 20.

The bonded wafer stack forming step 2 according to the present embodiment will be described on the assumption that the front surface 13 of the second wafer 10-2 is bonded to the front surface 13 of the first wafer 10-1. Note, however, that, in the case where the second wafer 10-2 is a substrate wafer, the surface of the second wafer 10-2 which is bonded to the first wafer 10-1 is not limited to the front surface 13. In the bonded wafer stack forming step 2, a bonding layer 19 is first formed on one of the front surface 13 of the first wafer 10-1 and the front surface 13 of the second wafer 10-2 as illustrated in FIG. 5. In the present embodiment, the bonding layer 19 is formed on the front surface 13 of the second wafer 10-2. In the present embodiment, the bonding layer 19 is a double-sided tape including a base layer and adhesive layers formed on both sides of the base layer. Note, however, that the bonding layer 19 is not limited to the double-sided tape in the embodiment of the present invention, may alternatively be, for example, an oxide film, or may be formed by application of an adhesive including, for example, a resin. Also, note that the first wafer 10-1 and the second wafer 10-2 may be directly bonded to each other without use of the bonding layer 19.

In the bonded wafer stack forming step 2, next, the front surface 13 of the first wafer 10-1 and the bonding layer 19 formed on the front surface 13 of the second wafer 10-2 are disposed opposite to each other with a gap therebetween as illustrated in FIG. 5. Next, the front surface 13 of the first wafer 10-1 and the front surface 13 of the second wafer 10-2 are bonded to each other through the bonding layer 19. As a result, the bonded wafer stack 20 is formed.

As illustrated in FIG. 6, in the bonded wafer stack 20, because of the warp of the outer circumferential region 16 caused by the first modified layer forming step 1, the front surface 13 of the first wafer 10-1 is not parallel to the bonding layer 19 at the outer circumferential region 16, and accordingly, the front surface 13 of the first wafer 10-1 is not closely adhered to the bonding layer 19. This results in incomplete bonding at the outer circumferential region 16.

(Second Modified Layer Forming Step 3)

Figure 7:
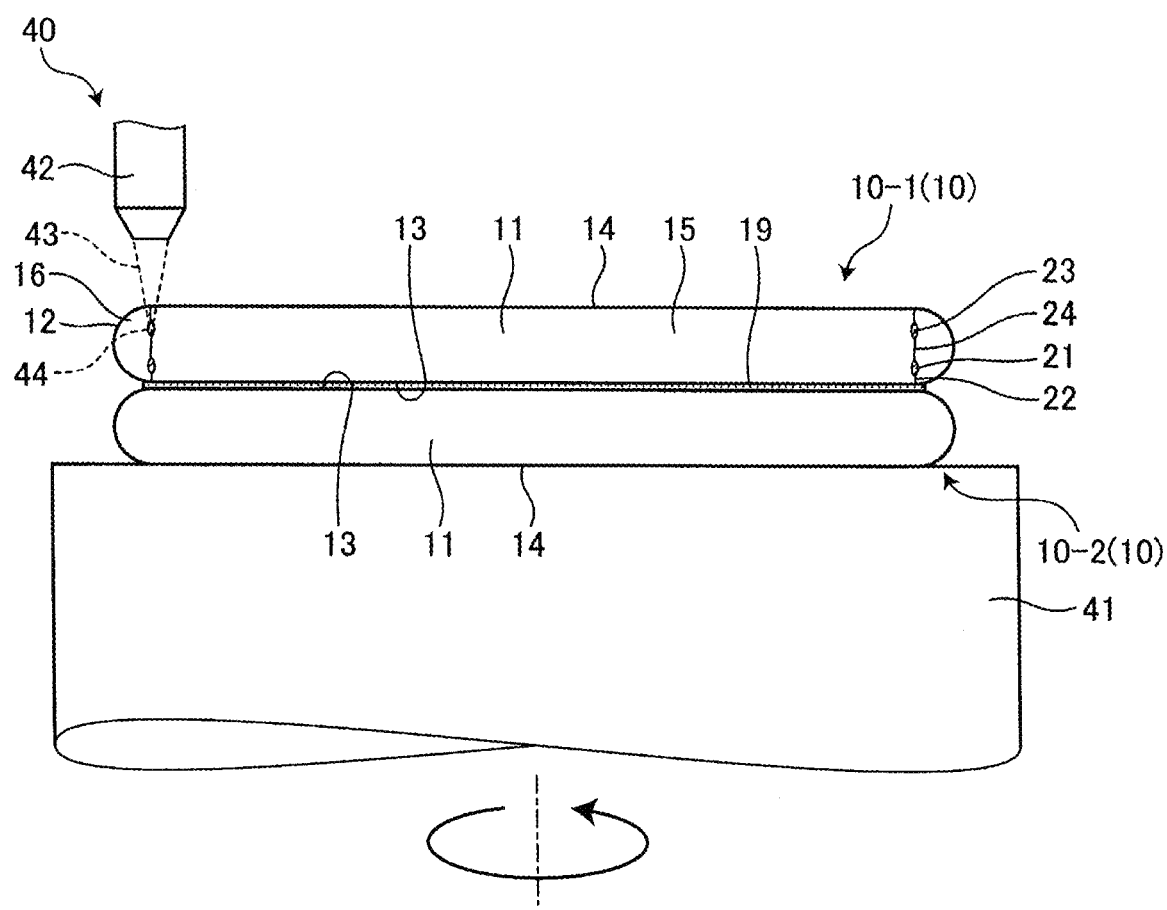
FIG. 7 is a side view illustrating, partly in section, a second modified layer forming step illustrated in FIG. 3.

FIG. 7 is a side view illustrating, partly in section, the second modified layer forming step 3 illustrated in FIG. 3. The second modified layer forming step 3 is performed after the bonded wafer stack forming step 2 is performed and before the grinding step 6 is performed. The second modified layer forming step 3 is a step of forming, in the first wafer 10-1, an annular second modified layer 23 and a second crack 24 along an annular line that is the predetermined distance inward of the outer circumferential edge 12 of the first wafer 10-1. The second crack 24 extends from the second modified layer 23 to be joined to the first modified layer 21. In the second modified layer forming step 3, the second modified layer 23 and the second crack 24 are formed in the first wafer 10-1 through stealth dicing using the laser processing apparatus 40.

In the second modified layer forming step 3, a laser beam 43 is applied along the annular line that is the predetermined distance inward of the outer circumferential edge 12 of the first wafer 10-1, whereby an annular modified layer (i.e., the second modified layer 23) is formed. In plan view, the annular line along which the laser beam 43 is applied coincides with the annular line along which the first modified layer 21 has been formed. The second modified layer 23 is formed at a position that is closer to the rear surface 14 than is the position at which the first modified layer 21 has been formed. The laser beam 43 is a laser beam at a wavelength capable of transmitting the first wafer 10-1, and the same processing conditions used for the laser beam 43 applied in the first modified layer forming step 1 may be used again.

In the second modified layer forming step 3, the rear surface 14 of the second wafer 10-2 is first held under suction on the holding surface (i.e., the upper surface) of the holding table 41. Next, the first wafer 10-1 and the condenser of the laser beam emitting unit 42 are aligned. Specifically, using the moving unit (not illustrated), the holding table 41 is moved to an irradiation region under the laser beam emitting unit 42.

Next, the first wafer 10-1 is imaged by the imaging unit (not illustrated), such an alignment to cause the emitting portion of the laser beam emitting unit 42 to be vertically opposed to and directed toward a position that is the predetermined distance inward of the outer circumferential edge 12 is made, and thereafter, the focal point 44 of the laser beam 43 is set within the first wafer 10-1. At this time, the focal point 44 is set at a position that is closer to the rear surface 14 of the first wafer 10-1 than is the position at which the first modified layer 21 has been formed in the thickness direction of the first wafer 10-1.

In the second modified layer forming step 3, next, while the holding table 41 is caused to rotate about the vertical axis, the laser beam 43 is emitted from the laser beam emitting unit 42 to enter into the first wafer 10-1 through the rear surface 14 thereof. That is, the laser beam 43 is applied along the annular line that is the predetermined distance inward of the outer circumferential edge 12 of the first wafer 10-1, so that an annular continuous modified layer (i.e., the second modified layer 23) is formed.

At this time, a crack (i.e., the second crack 24) extends from the second modified layer 23 to be joined to the first modified layer 21. The second crack 24 may extend so as to make an appearance on the rear surface 14 of the first wafer 10-1. As described above, division start positions made up of the first modified layer 21, the first crack 22, the second modified layer 23, and the second crack 24 are formed within the first wafer 10-1 at the boundary between the device region 15 and the outer circumferential region 16.

(Third Modified Layer Forming Step 4)

Figure 8:
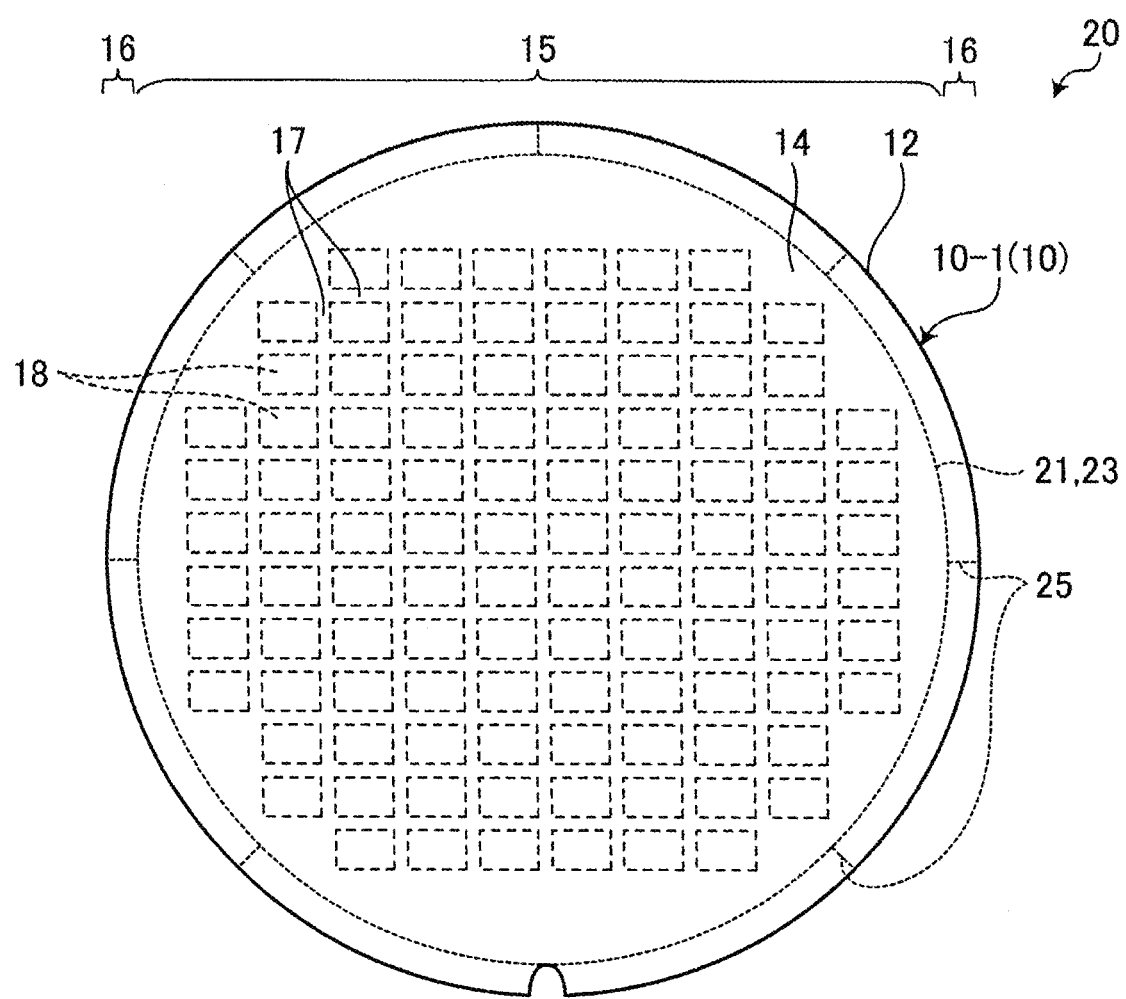
FIG. 8 is a plan view illustrating an example of the bonded wafer stack obtained after the third modified layer forming step illustrated in FIG. 3.

FIG. 8 is a plan view illustrating an example of the bonded wafer stack 20 obtained after the third modified layer forming step 4 illustrated in FIG. 3. The third modified layer forming step 4 is performed after the first modified layer forming step 1 is performed and before the grinding step 6 is performed. The third modified layer forming step 4 is a step of forming radial third modified layers 25 that divide the outer circumferential region 16 into at least two sections. In the third modified layer forming step 4, the third modified layers 25 are formed in the first wafer 10-1 through stealth dicing using the laser processing apparatus 40.

As illustrated in FIG. 8, in the third modified layer forming step 4, the radial third modified layers 25 are each formed as a result of a laser beam 43 being applied along a radial direction in the outer circumferential region 16 of the first wafer 10-1, which lies closer to the outer circumferential edge 12 than does the position where the first modified layer 21 and the second modified layer 23 have been formed. That is, at a predetermined circumferential position in the outer circumferential region 16 of the first wafer 10-1, each third modified layer 25, which forms a division start position, is formed along the radial direction between an inner circumferential edge of the outer circumferential region 16 and the outer circumferential edge 12. The laser beam 43 is a laser beam at a wavelength capable of transmitting the first wafer 10-1, and the same processing conditions used for the laser beam 43 applied in each of the first modified layer forming step 1 and the second modified layer forming step 3 may be used again.

In the third modified layer forming step 4, first, the first wafer 10-1 and the laser beam emitting unit 42 are aligned to cause the emitting portion of the laser beam emitting unit 42 to be opposed to and directed toward the predetermined circumferential position in the outer circumferential region 16, and thereafter, the focal point 44 of the laser beam 43 is set within the first wafer 10-1.

Next, while the holding table 41 and the laser beam emitting unit 42 are caused to move relative to each other through the moving unit (not illustrated), the laser beam 43 is emitted from the laser beam emitting unit 42 to enter into the first wafer 10-1 through the rear surface 14 thereof. At this time, the holding table 41 is caused to move such that the focal point 44 of the laser beam 43 moves radially outward with respect to the first wafer 10-1. That is, the laser beam 43 is applied in the radial direction to the outer circumferential region 16, so that a radially continuous third modified layer 25 is formed.

In the third modified layer forming step 4 illustrated in FIG. 8, the outer circumferential region 16 is divided into eight sections along the circumferential direction. Note, however, that the outer circumferential region 16 may alternatively be divided into, for example, twice as many sections, i.e., sixteen sections, in the embodiment of the present invention, and that the number of divided sections may be set as appropriate in accordance with the diameter of the first wafer 10-1 and the width of the outer circumferential region 16. It has been assumed in the above description that the laser beam 43 is emitted while the holding table 41 is caused to move such that the focal point 44 moves radially outward with respect to the first wafer 10-1. Note, however, that, in the embodiment of the present invention, the laser beam 43 may alternatively be emitted while the holding table 41 is caused to move such that the focal point 44 moves radially inward with respect to the first wafer 10-1. In this case, the emission of the laser beam 43 is stopped at the time when the focal point 44 has reached the third modified layer 25. Also, note that, in the method for processing the wafer 10, the third modified layers 25 may not necessarily be formed, and the third modified layer forming step 4 may be omitted.

(Removing Step 5)

Figure 9:
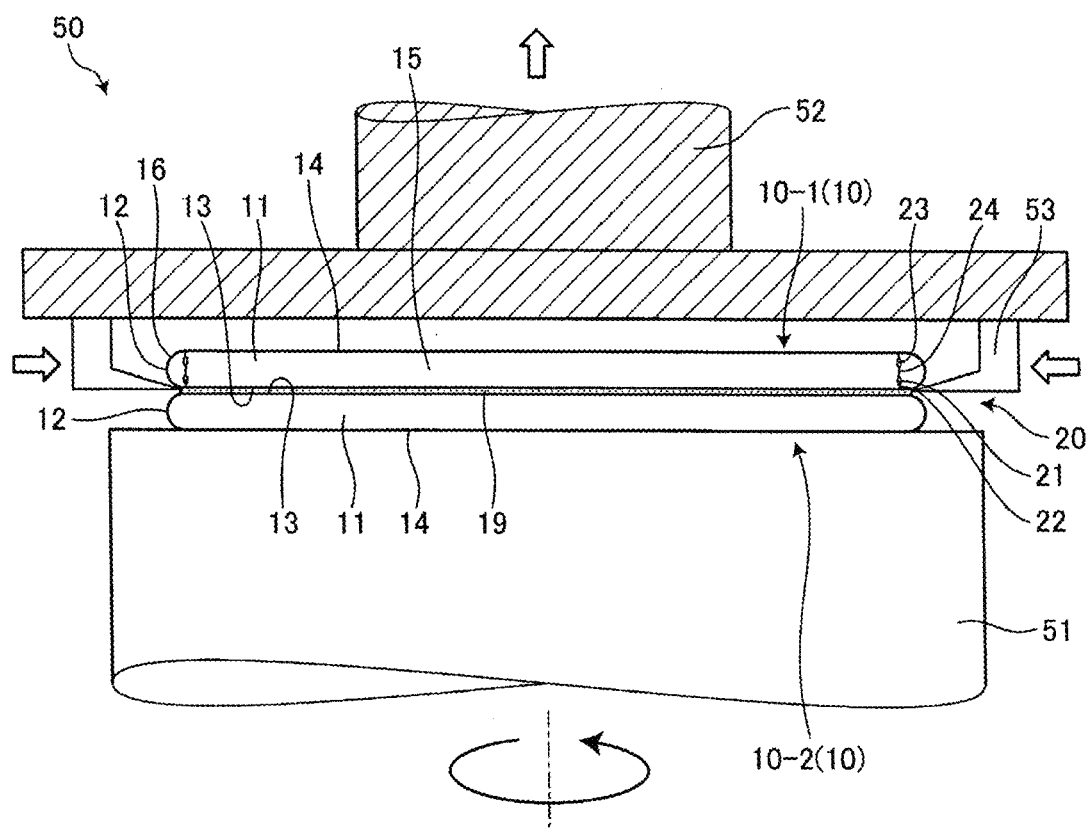
FIG. 9 is a side view illustrating, partly in section, a removing step illustrated in FIG. 3.

FIG. 9 is a side view illustrating, partly in section, the removing step 5 illustrated in FIG. 3. The removing step 5 is a step of applying an external force to the outer circumferential region 16 of the first wafer 10-1 to remove the outer circumferential region 16. In the removing step 5 according to the present embodiment, with the second wafer 10-2 being held by a removing apparatus 50 illustrated in FIG. 9, the outer circumferential region 16 of the first wafer 10-1 is lifted to cause a shear force to be applied in the thickness direction to remove the outer circumferential region 16.

The removing apparatus 50 includes a holding table 51 and a removing unit 52. The holding table 51 is used to hold the wafer 10 (i.e., the second wafer 10-2) on a holding surface thereof and is capable of rotating about a vertical axis. The removing unit 52 is capable of moving in the vertical direction relative to the holding table 51. The removing unit 52 includes one or more pairs of gripping members 53 provided on a lower side thereof. Each gripping member 53 projects downward from the lower side of the removing unit 52 and has a wedge-shaped portion with a distal end pointed inward. The pair of gripping members 53 are each capable of moving in a radial direction in plan view. The removing apparatus 50 further includes a moving unit (not illustrated) that causes the holding table 51 and the removing unit 52 to move relative to each other.

In the removing step 5, the rear surface 14 of the second wafer 10-2 is first held under suction on the holding surface (i.e., an upper surface) of the holding table 51. Next, the first wafer 10-1 and the gripping members 53 of the removing unit 52 are aligned. Specifically, using the moving unit (not illustrated), the holding table 51 is moved to an area under the removing unit 52, and the distal ends of the gripping members 53 are opened radially outward beyond the outer circumferential edge 12 of the first wafer 10-1.

In the removing step 5, next, the removing unit 52 is lowered downward to such a height that the distal ends of the gripping members 53 are directed toward a boundary between the first wafer 10-1 and the second wafer 10-2. Next, the gripping members 53 are moved radially inward to cause the distal ends of the gripping members 53 to be inserted into a gap between the first wafer 10-1 and the second wafer 10-2. Next, the removing unit 52 is lifted upward, so that upper sides of the distal ends of the gripping members 53 raise the outer circumferential region 16 of the first wafer 10-1 from the front surface 13 thereof. An upward external force is thus applied to the outer circumferential region 16, so that the device region 15 and the outer circumferential region 16 are divided from each other, with each of the first modified layer 21, the second modified layer 23, and the third modified layers 25 serving as a division start position, resulting in removal of the outer circumferential region 16 of the first wafer 10-1.

(Grinding Step 6)

Figure 10:
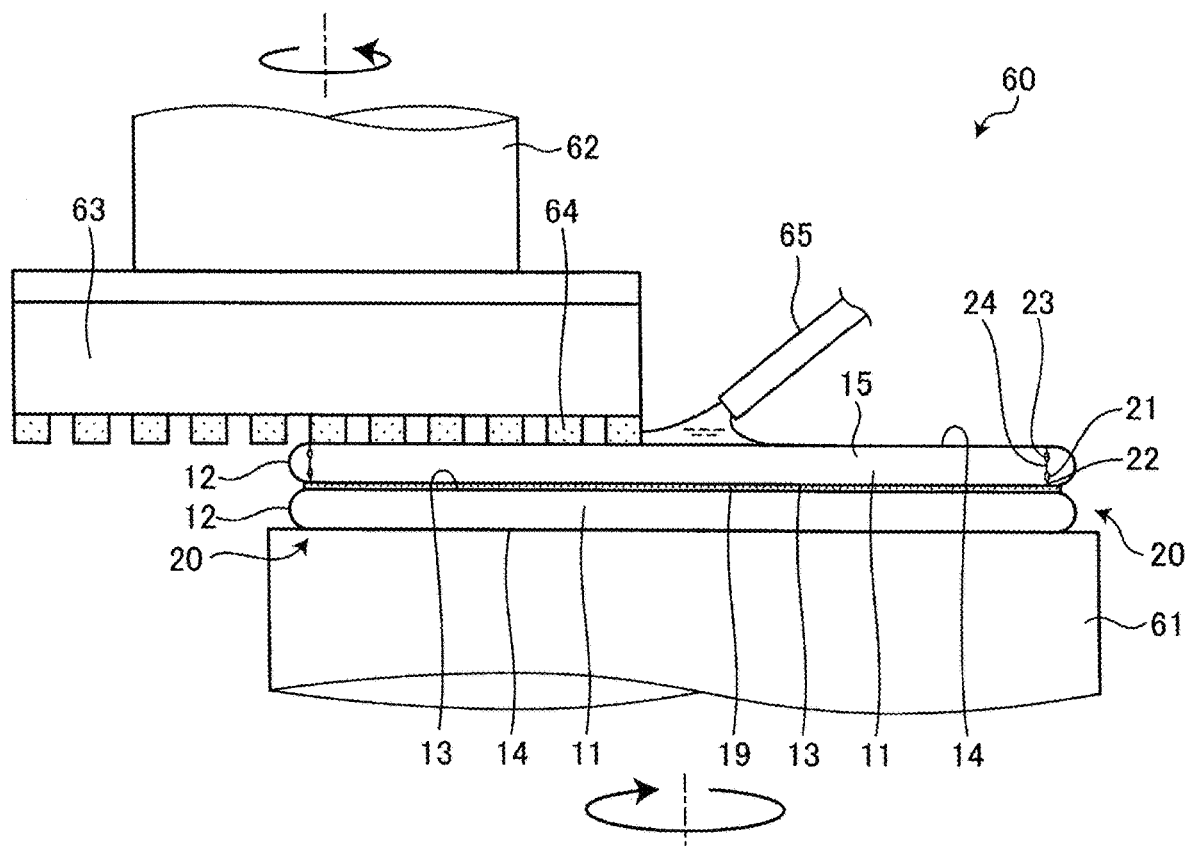
FIG. 10 is a side view illustrating, partly in section, a grinding step illustrated in FIG. 3.
Figure 11:
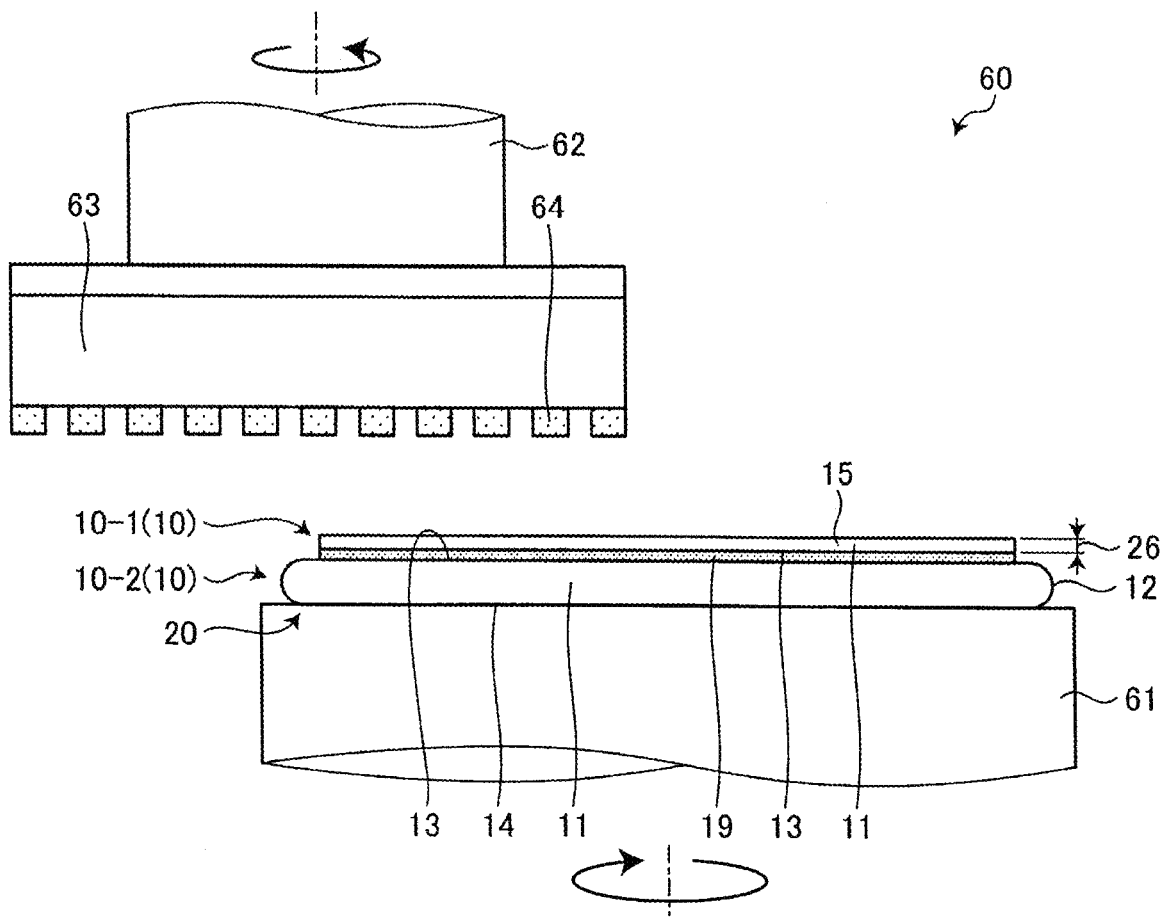
FIG. 11 is a side view illustrating, partly in section, one state of the grinding step illustrated in FIG. 3 subsequent to that of FIG. 10.

FIG. 10 is a side view illustrating, partly in section, the grinding step 6 illustrated in FIG. 3. FIG. 11 is a side view illustrating, partly in section, one state of the grinding step 6 illustrated in FIG. 3 subsequent to that of FIG. 10. The grinding step 6 is performed after the bonded wafer stack forming step 2 is performed. The grinding step 6 is a step of grinding the rear surface 14 of the first wafer 10-1 of the bonded wafer stack 20 to thin the first wafer 10-1 to the finish thickness 26.

In the case where the second modified layer forming step 3 (and the third modified layer forming step 4) and the removing step 5 are performed in the method for processing the wafer 10, the grinding step 6 is performed after these steps. Note that FIG. 10 illustrates a case where the second modified layer forming step 3 is performed, the removing step 5 is not performed, and the grinding step 6 is performed with the outer circumferential region 16 remaining in the first wafer 10-1.

In the grinding step 6, using a grinding apparatus 60, the rear surface 14 of the first wafer 10-1 is ground, so that the first wafer 10-1 is thinned to the predetermined finish thickness 26. The grinding apparatus 60 includes a holding table 61, a spindle 62, which is a rotating shaft member, a grinding wheel 63 attached to a lower end of the spindle 62, grindstones 64 attached to a lower surface of the grinding wheel 63, and a grinding fluid feeding unit 65. The grinding wheel 63 rotates about a rotation axis parallel to an axis of the holding table 61.

In the grinding step 6, the rear surface 14 of the second wafer 10-2 is first held under suction on a holding surface of the holding table 61. Next, while the holding table 61 is caused to rotate about the axis thereof, the grinding wheel 63 is caused to rotate about the axis thereof. A grinding fluid is fed to a processing area through the grinding fluid feeding unit 65, and, at the same time, the grindstones 64 of the grinding wheel 63 are brought toward the holding table 61 at a predetermined feed rate, whereby the rear surface 14 of the first wafer 10-1 is ground by the grindstones 64 to thin the first wafer 10-1 to the predetermined finish thickness 26. At this time, the outer circumferential region 16 of the first wafer 10-1 is removed by a grinding load.

As described above, in the method for processing the wafer 10 according to the present embodiment, before the first wafer 10-1 is bonded to the second wafer 10-2, the annular first modified layer 21 is formed along the annular line that is the predetermined distance inward of the outer circumferential edge 12, and the first crack 22 extending from the first modified layer 21 up to the front surface 13 is allowed to form. This results in a warp of the outer circumferential region 16, causing a poor bonding or reduced bonding strength of the bonded wafer stack 20 at the warped outer circumferential region 16. Thus, an effect of easier removal of the unnecessary outer circumferential region 16 is produced, with the first modified layer 21 serving as a start position. This makes it possible to remove the outer circumferential region 16 while preventing an edge cut that occurs in the first wafer 10-1 during grinding from extending into any device 18, and thus preventing damage to the device 18.

Note that the present invention is not limited to the above-described embodiment. That is, various modifications may be made to the above-described embodiment without departing from the gist of the present invention.

For example, the method for applying the external force in the removing step 5 is not limited to the method of the above-described embodiment, in which the outer circumferential region 16 is lifted to apply an external force acting in the shear direction. For example, a method of pressing the outer circumferential region 16 from above or crushing by a roller may alternatively be adopted. Also, note that not only a mechanical external force but also vibration caused by an ultrasonic wave or a radial external force caused by expanding an expandable tape attached to the rear surface 14 of the first wafer 10-1 may alternatively be used.

Also, note that, as in a first modification or a second modification described below, other modified layers (e.g., fourth modified layers 27 and fifth modified layers 29) may be formed on the side of the first modified layer 21 closer to the outer circumferential edge 12.

(First Modification)

Figure 12:
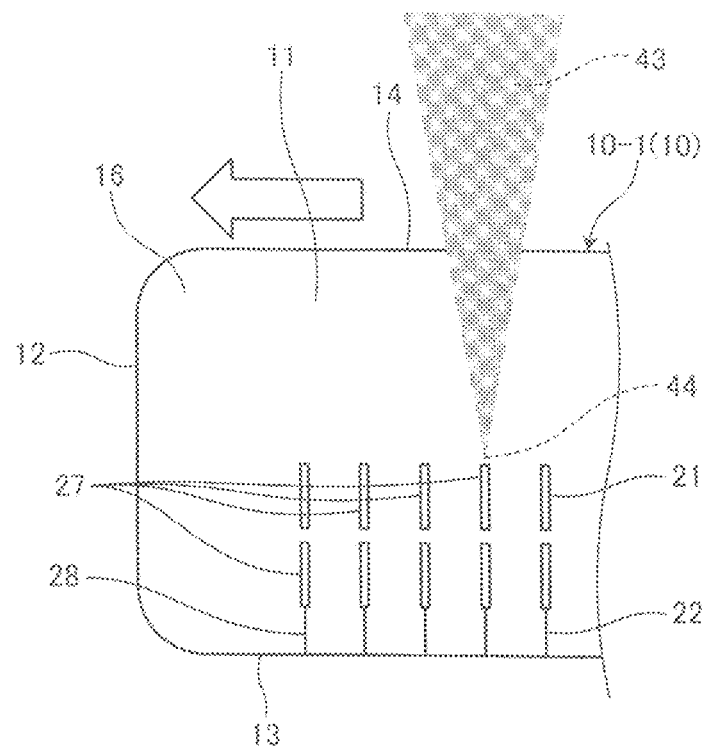
FIG. 12 is a sectional view illustrating the first wafer during a fourth modified layer forming step according to a first modification.
Figure 13:
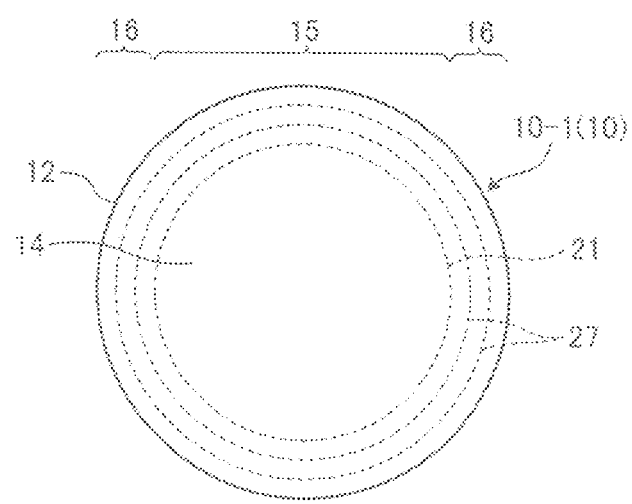
FIG. 13 is a plan view illustrating an example of the first wafer obtained after the fourth modified layer forming step according to the first modification.

FIG. 12 is a sectional view illustrating the first wafer 10-1 during a fourth modified layer forming step according to the first modification. FIG. 13 is a plan view illustrating an example of the first wafer 10-1 obtained after the fourth modified layer forming step according to the first modification. The fourth modified layer forming step is performed before the bonded wafer stack forming step 2 is performed. The fourth modified layer forming step is a step of forming, in the first wafer 10-1, a plurality of annular fourth modified layers 27 and a plurality of fourth cracks 28 along annular lines that are each a predetermined distance outward of the annular line along which the first modified layer 21 is formed. Each fourth crack 28 extends from the corresponding fourth modified layer 27 to make an appearance on the front surface 13.

That is, in the fourth modified layer forming step, the plurality of fourth modified layers 27, each of which is concentric with the annular first modified layer 21, are formed on the side of the first modified layer 21 closer to the outer circumferential edge 12. In a case where a plurality of such annular fourth modified layers 27 are formed, the fourth modified layer forming step can be implemented by a procedure substantially the same as that of the first modified layer forming step 1.

In the fourth modified layer forming step, the fourth modified layers 27 and the fourth cracks 28 are formed in the first wafer 10-1 through stealth dicing using the laser processing apparatus 40. First, the first wafer 10-1 and the laser beam emitting unit 42 are aligned to cause the emitting portion of the laser beam emitting unit 42 to be opposed to and directed toward a predetermined position that is closer to the outer circumferential edge 12 than is the first modified layer 21, and thereafter, the focal point 44 of the laser beam 43 is set within the first wafer 10-1. At this time, the focal point 44 is set at a position that is closer to the front surface 13 than is the middle in the thickness direction of the first wafer 10-1.

Next, as in the first modified layer forming step 1, while the holding table 41 is caused to rotate about the vertical axis, the laser beam 43 is emitted from the laser beam emitting unit 42 to enter into the first wafer 10-1 through the rear surface 14 thereof. As a result, an annular continuous fourth modified layer 27 concentric with the first modified layer 21 is formed on the side of the first modified layer 21 closer to the outer circumferential edge 12.

At this time, a crack (i.e., the fourth crack 28) extends from the fourth modified layer 27 to make an appearance on the front surface 13. The fourth modified layer 27 and the fourth crack 28 are expanded to cause the first wafer 10-1 to become warped at the outer circumferential region 16, which lies closer to the outer circumferential edge 12 than does the first modified layer 21 and the first crack 22, with a protruding surface formed on the front surface 13.

This warp is greater in the case where the plurality of fourth modified layers 27 are additionally formed than in a case where only the first modified layer 21 is formed. Specifically, in the case where the first modified layer 21 is formed at a position that is 2 mm inward of the outer circumferential edge 12 of the first wafer 10-1, having a diameter of 300 mm, for example, a warp that causes the front surface 13 to move toward the rear surface 14 by approximately 1 to 2 μm at the outer circumferential edge 12 occurs. In contrast, in the case where the plurality of fourth modified layers 27 are formed, the warp causes the front surface 13 to move toward the rear surface 14 by approximately 10 to 20 μm at the outer circumferential edge 12.

Note that, in the fourth modified layer forming step, similarly to the case with the first modified layer forming step 1, a plurality of fourth modified layers 27 may be formed one above another in the thickness direction of the first wafer 10-1. This can be accomplished by applying the laser beam 43 a plurality of times with the height of the focal point 44 of the laser beam 43 changed for each application or by applying a laser beam 43 having a plurality of focal points 44 apart from each other in the thickness direction of the first wafer 10-1. In this case, the fourth modified layers 27 arranged one above another in the thickness direction are, as a whole, formed at a position that is closer to the front surface 13 than is the middle in the thickness direction of the first wafer 10-1.

(Second Modification)

Figure 14:
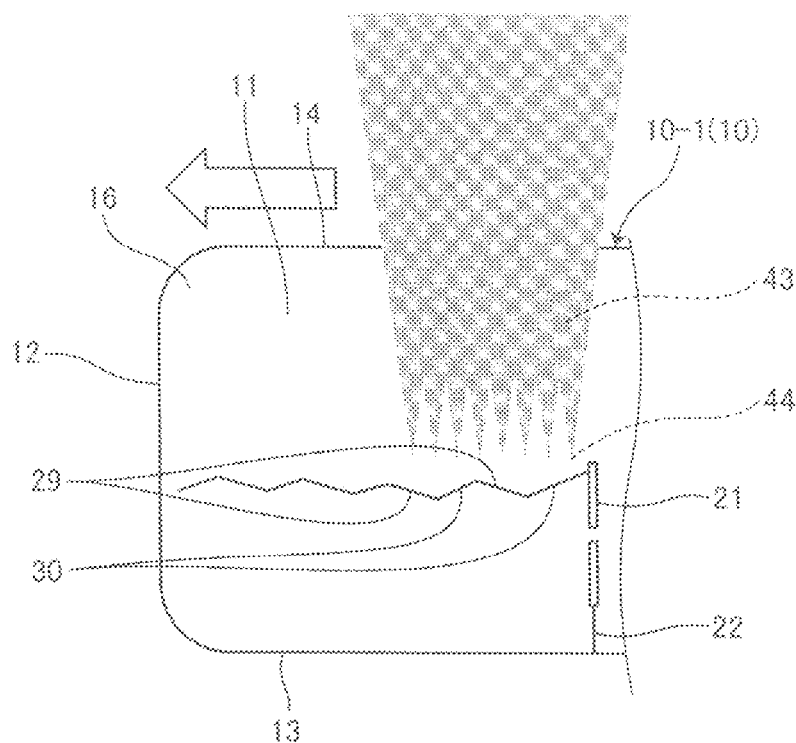
FIG. 14 is a sectional view illustrating the first wafer during a fifth modified layer forming step according to a second modification.
Figure 15:
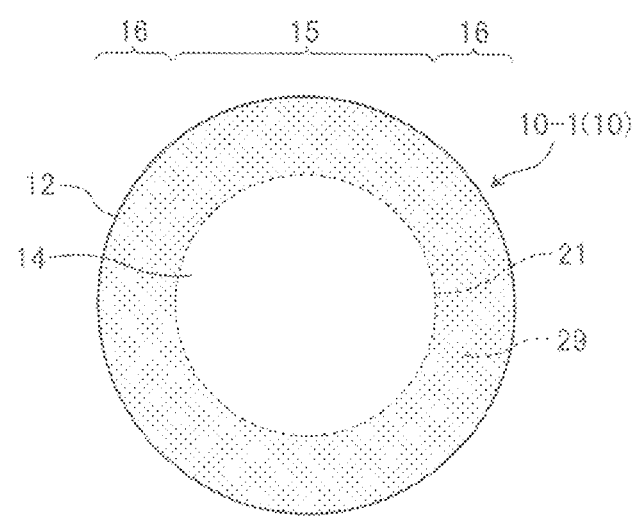
FIG. 15 is a plan view illustrating an example of the first wafer obtained after the fifth modified layer forming step according to the second modification.

FIG. 14 is a sectional view illustrating the first wafer 10-1 during a fifth modified layer forming step according to the second modification. FIG. 15 is a plan view illustrating an example of the first wafer 10-1 obtained after the fifth modified layer forming step according to the second modification. The fifth modified layer forming step is performed before the bonded wafer stack forming step 2 is performed. The fifth modified layer forming step is a step of forming, in the outer circumferential region 16 of the first wafer 10-1, a fifth modified layer 29 and a fifth crack 30 extending from the fifth modified layer 29 in parallel with the front surface 13 of the first wafer 10-1. Note that the fifth crack 30 extending in parallel with the front surface 13 means that the inclination of an approximate plane obtained by approximating the whole of the extended fifth crack 30 to a plane with respect to the horizontal plane is within ±5 degrees, more preferably, within ±2 degrees.

In the fifth modified layer forming step, the fifth modified layer 29 and the fifth crack 30 are formed in the first wafer 10-1 through stealth dicing using the laser processing apparatus 40. First, the first wafer 10-1 and the laser beam emitting unit 42 are aligned to cause the emitting portion of the laser beam emitting unit 42 to be opposed to and directed toward a position that is closer to the outer circumferential edge 12 than is the position at which the first modified layer 21 has been formed, and thereafter, focal points 44 of the laser beam 43 are set within the first wafer 10-1. At this time, the focal points 44 are formed at a plurality of radial positions in the outer circumferential region 16 of the first wafer 10-1.

Next, as in the third modified layer forming step 4, while the holding table 41 is caused to rotate about the vertical axis, the laser beam 43 is emitted from the laser beam emitting unit 42 to enter into the first wafer 10-1 through the rear surface 14 thereof. That is, the laser beam 43 is emitted such that the plurality of focal points 44 of the laser beam 43, apart from one another in the radial direction, move along the outer circumferential edge 12. Once one round of the processing of the outer circumferential region 16 is complete, the same processing is repeated concentrically, with the positions of the plurality of focal points 44 shifted in the radial direction, until the whole of the outer circumferential region 16, which is annular in plan view, is processed. Thus, the annular fifth modified layers 29 are formed throughout the outer circumferential region 16.

At this time, cracks (i.e., the fifth cracks 30) extend from the fifth modified layers 29 in parallel with the front surface 13 of the first wafer 10-1 to spread over the whole outer circumferential region 16 in plan view. As a result, a layer that separates a portion on the side closer to the front surface 13 and a portion on the side closer to the rear surface 14 is formed in the outer circumferential region 16 of the first wafer 10-1. The fifth modified layers 29 and the fifth cracks 30 are expanded to cause the first wafer 10-1 to become warped at the outer circumferential region 16, which lies closer to the outer circumferential edge 12 than does the first modified layer 21 and the first crack 22, with a protruding surface formed on the front surface 13.

This warp is greater in the case where the fifth modified layers 29 are additionally formed than in the case where only the first modified layer 21 is formed. Specifically, in the case where the first modified layer 21 is formed at the position that is 2 mm inward of the outer circumferential edge 12 of the first wafer 10-1, having a diameter of 300 mm, for example, a warp that causes the front surface 13 to move toward the rear surface 14 by approximately 1 to 2 μm at the outer circumferential edge 12 occurs. In contrast, in the case where the fifth modified layers 29 are formed, the warp causes the front surface 13 to move toward the rear surface 14 by approximately 2 to 5 μm at the outer circumferential edge 12.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method comprising:
a first modified layer forming step of emitting, onto a first wafer having a plurality of devices formed on a front surface thereof and having a chamfered outer circumferential edge, a laser beam at a wavelength capable of transmitting the first wafer such that the laser beam is applied along an annular line that is a predetermined distance inward of the outer circumferential edge of the first wafer to form, in the first wafer, an annular first modified layer and a first crack extending from the first modified layer to make an appearance on the front surface of the first wafer, thereby causing the first wafer to become warped at an outer circumferential region thereof that lies closer to the outer circumferential edge than does the first modified layer and the first crack;
a bonded wafer stack forming step of, after the first modified layer forming step is performed, bonding the front surface of the first wafer to a second wafer to form a bonded wafer stack; and
a grinding step of, after the bonded wafer stack forming step is performed, grinding a rear surface of the first wafer of the bonded wafer stack to thin the first wafer to a finish thickness.

2. The wafer processing method according to claim 1, further comprising:
after the bonded wafer stack forming step and before the grinding step,
a second modified layer forming step of emitting a laser beam at a wavelength capable of transmitting the first wafer to enter into the first wafer through the rear surface such that the laser beam is applied along the annular line that is the predetermined distance inward of the outer circumferential edge of the first wafer to form, in the first wafer, an annular second modified layer and a second crack extending from the second modified layer to be joined to the first modified layer; and
a removing step of applying an external force to the outer circumferential region to remove the outer circumferential region.

3. The wafer processing method according to claim 1, further comprising:
after the first modified layer forming step and before the grinding step,
a third modified layer forming step of emitting a laser beam at a wavelength capable of transmitting the first wafer onto the outer circumferential region such that the laser beam is applied in a radial manner to form radial third modified layers that divide the outer circumferential region into at least two sections.

4. The wafer processing method according to claim 1, further comprising the following step performed before the bonded wafer stack forming step:
a fourth modified layer forming step of emitting a laser beam at a wavelength capable of transmitting the first wafer onto the outer circumferential region such that the laser beam is applied along annular lines that are each a predetermined distance outward of the annular line along which the first modified layer is formed in the first modified layer forming step to form, in the first wafer, a plurality of annular fourth modified layers and a plurality of fourth cracks each extending from a corresponding one of the fourth modified layers to make an appearance on the front surface of the first wafer.

5. The wafer processing method according to claim 1, further comprising the following step performed before the bonded wafer stack forming step:
a fifth modified layer forming step of emitting a laser beam at a wavelength capable of transmitting the first wafer onto the outer circumferential region to form, in the first wafer, a fifth modified layer and a fifth crack extending from the fifth modified layer in parallel with the front surface of the first wafer.

* * * * *